(12) United States Patent
Asano et al.

(10) Patent No.: US 6,407,422 B1
(45) Date of Patent: Jun. 18, 2002

(54) OXYGEN DIFFUSION BLOCKING SEMICONDUCTOR CAPACITOR

(75) Inventors: Katsuaki Asano; Yasuyuki Ito; Shun Mitarai; Akihiko Ochiai, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/556,571

(22) Filed: Apr. 24, 2000

(30) Foreign Application Priority Data

Apr. 23, 1999 (JP) ............................................ 11-115688

(51) Int. Cl.$^7$ ............................................ H01L 27/108
(52) U.S. Cl. ...................... 257/306; 257/296; 257/310; 438/244; 438/253; 438/387; 438/396
(58) Field of Search ................................ 257/296, 306, 257/310; 438/238, 239, 399, 253, 387, 396, 240

(56) References Cited

U.S. PATENT DOCUMENTS

| | | | | |
|---|---|---|---|---|
| 5,348,894 A | * | 9/1994 | Gnade et al. | 438/396 |
| 5,612,574 A | * | 3/1997 | Summerfelt et al. | 257/783 |
| 5,744,832 A | * | 4/1998 | Wolters et al. | 257/295 |
| 5,790,366 A | * | 8/1998 | Desu et al. | 361/305 |
| 6,190,963 B1 | * | 2/2001 | Zhang et al. | 438/254 |

FOREIGN PATENT DOCUMENTS

JP       63312663 A  *  12/1988  ........... H01L/27/04

* cited by examiner

Primary Examiner—Nathan Flynn
Assistant Examiner—Scott R. Wilson
(74) Attorney, Agent, or Firm—Sonnenschein, Nath & Rosenthal

(57) ABSTRACT

Provided is a semiconductor memory device in which defective contact, deterioration in transistor characteristics and other problems are solved with a thermally stable, conductive diffusion barrier layer against oxygen, and against constituent elements in a plug material and a lower electrode, formed at the interface between a plug and the lower electrode made of a noble metal. The semiconductor memory device comprises a dielectric capacitor of a stacked structure including a first electrode (a lower electrode), a dielectric film and a second electrode (an upper electrode) and a conductive plug connected to the lower electrode, wherein the lower electrode connected to the conductive plug includes a metal suboxide layer with conductiveness and a diffusion barrier layer blocking diffusion of oxygen, and the metal suboxide layer and the diffusion barrier layer are stacked in the order from the conductive plug side of the lower electrode.

67 Claims, 4 Drawing Sheets

(Prior Art)

OXYGEN DIFFUSION BLOCKING SEMICONDUCTOR CAPACITOR

BACKGROUND OF THE INVENTION

1. Field of the Invention

This invention relates to a semiconductor memory device and particularly, to a semiconductor memory device with a dielectric film made of a high dielectric-constant film material or ferroelectric film material.

2. Description of the Related Art

In recent years, developments have been made of semiconductor memory devices with a dielectric film having a high dielectric constant compared to a silicon oxide film or with a ferroelectric film having a spontaneous polarization characteristic. As high dielectric-constant materials, there can be exemplified STO ($SrTiO_3$, strontium titanate), BSTO ($(Ba, Sr)TiO_3$, barium strontium titanate) and so forth. As ferroelectric materials, there can be exemplified PZT ($Pb(Zr, Ti)O_3$, lead titanate zirconate), PLZT ($(Pb, La)(Zr, Ti)O_3$, lead lanthanum zirconate titanate), SBT ($SrBi_2Ta_2O_9$, strontium bismuth tantalate) and so forth. As fabrication methods for thin films of the above-mentioned materials, there can be exemplified a sol-gel processing method, an MOD (Metal Organic Decomposition) method, a rotary coating method, a sputtering method and an MOCVD (Metal Organic Chemical Vapor Decomposition) method and so forth.

High dielectric-constant materials such as STO and BSTO can be produced at a comparatively low temperature of the order from 300° C. to 600° C. Further, PZT, which is a perovskite structure oxide of a ferroelectric material, can also be produced at a comparatively low temperature of about 600° C. However, a material containing lead as a constituent element, such as PZT, has had a problem: Defects generate in a film of the material during deposition because of evaporation of lead due to high vapor pressures of lead element and an oxide thereof and pin holes are also simultaneously formed in a worse case. As a result, leakage currents from a memory cell increases and when inversion of polarization is repeated million to hundred million times, there arises problematically a kind of fatigue phenomenon of reduction in magnitude of spontaneous polarization. Particularly, in the field of FeRAM constituted of ferroelectric nonvolatile memory, therefore, a ferroelectric film with less of the fatigue phenomenon during the use over time is sought.

On the other hand, development of bismuth layered structure compounds has been in progress. The bismuth layered structure compounds were discovered by Smolenskii et al. in 1959, which is disclosed in G. A. Smolenskii, V. A. Isupov and A. I. Agranovskaya, Soviet Phys. Solid State (USSR), 1 (1959), p. 149 and thereafter, a detailed investigation has been further conducted by Subbarao, which is disclosed in E. C. Subbarao, J. Phys. Chem. Solids (USA), 23 (1962), p. 665. Brsides, Carlos A. Paz de Araujo et al. have uncovered that an SBT film of the bismuth layered structure compounds is suited for FeRAM and has reported an excellent anti-fatigue characteristic that no change occurs in characteristics especially after repetitions of polarization inversion in more than trillion times. In addition, an electric field of an SBT film required for inversion of polarization is low compared with a PTZ film, the SBT film is especially suitable for a highly integrated FeRAM with a decreased drive voltage. In formation of the SBT film, however, a problem has remained since a high temperature process of the order from 700° C. to 800° C. is required.

Then, description will be given of an example of a conventional semiconductor memory device with reference to a simplified, sectional view of a construction thereof of FIG. 5.

Figure 5:
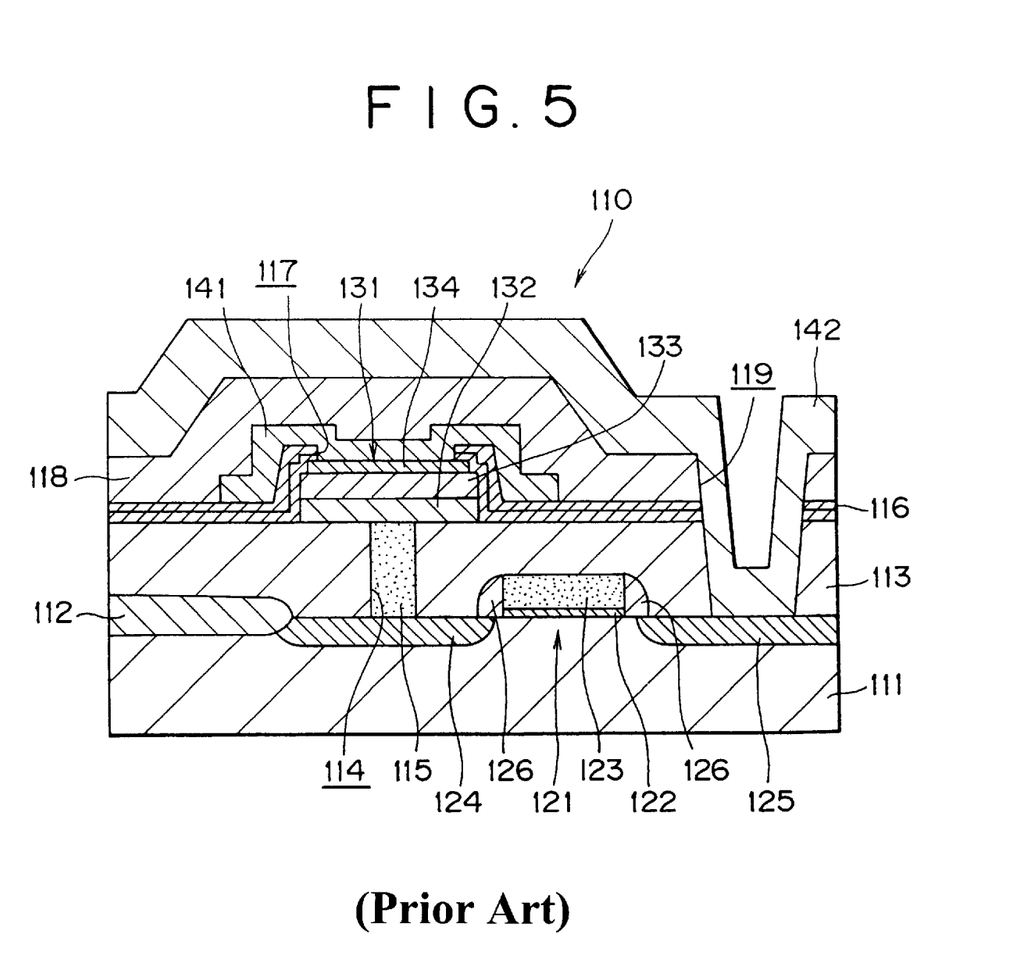
FIG. 5 is a simplified, sectional view schematically showing a construction of a conventional semiconductor memory device.

As shown in FIG. 5, an inter-element isolation oxide film 112 is formed on a semiconductor substrate (for example, a first conductivity type silicon substrate) 111 to isolate element formation regions. In an element formation region, a transistor 121 is formed. The transistor 121 is constructed of a gate oxide film 122 formed on the semiconductor substrate 111, a polysilicon word line (including a gate electrode) 123 formed on the gate oxide film 122, and impurity diffusion regions 124 and 125 of the first conductivity type and a second conductivity type of an opposite polarity therefrom formed on respective both sides of the gate electrode portion on the semiconductor substrate 111. A side wall insulation film 126 is formed on a side wall of the polysilicon word line 123.

An interlayer insulation film 113 covering the transistor 121 is formed on the semiconductor substrate 111. In the interlayer insulation film 113, a contact hole 114 reaching the impurity diffusion region 124 is formed and in the inside of the contact hole 114, there is formed a conductive plug 115 of a memory cell section, connected to the impurity diffusion region 124.

On the interlayer insulation film 113, a lower electrode 132 of a dielectric capacitor 131 connected to the conductive plug 115, a dielectric film 133 and an upper electrode 134 are stacked. The dielectric capacitor 131 is covered with an interlayer insulation film 116 and an opening 117 is formed on the upper electrode 134 of the dielectric capacitor 131. Further, there is provided a plate line 141 connected to the upper electrode 134 through the opening 117.

Still further, there is provided an interlayer insulation film 118 covering the plate line 141. In the interlayer insulation films 118, 116 and 113, a bit contact hole 119 reaching the other impurity diffusion region 125 is formed and through the bit contact hole 119, there is formed a bit line 142 connected to the second conductivity type impurity diffusion region 125.

A semiconductor device 110 with a dielectric capacitor 131 using the dielectric film 133 made of a conventional high dielectric-constant material or a ferroelectric material, as mentioned above, adopts a stacked structure in which the ferroelectric capacitor 131 constructed of the lower electrode 132, the ferroelectric film 133 and the upper electrode 134 is formed on the transistor 121. With this stacked structure adopted, a memory cell region is reduced in area, thereby making a high degree of integration possible. In order to realize such a stacked structure, a requirement is a plug structure using a conductive plug to connect between the transistor (selection transistor) 121 and the dielectric capacitor 131.

As materials of the lower electrode of a dielectric capacitor, there have been used noble metals such as platinum, iridium and ruthenium from the standpoint of resistances to oxidation, reaction and so forth.

In a process of formation of a high dielectric-constant film or a ferroelectric film used in a dielectric capacitor, a treatment in a high temperature oxidative atmosphere at a temperature in the range of from 500° C. to 800° C. is indispensable in order to attain a high dielectric constant or ferroelectricity through crystallization. There have been arisen various problems in the course of commercialization of highly integrated semiconductor memory device with such a dielectric capacitor since, at a high temperature in a process of formation of a dielectric film, a lower noble metal electrode of the dielectric capacitor and polysilicon plug or tungsten plug are reacted with each other; a plug is oxidized to cause defective contact; a noble metal, constituent elements in the dielectric film or the like diffuse into a substrate to deteriorate transistor characteristics; or to cause other inconveniences. Therefore, there has been a necessity to provide a conductive, diffusion barrier layer being thermally stable and serving as a strong barrier against oxygen atoms and constituent elements of the plug and the lower electrode, between the plug and the lower noble metal electrode.

In general, while titanium nitride has thus far used as a material for the diffusion barrier layer, problems have occurred since the titanium nitride is oxidized in a heat treatment in a high temperature oxidative atmosphere to deteriorate conductance, causes peeling or have the like faults. Further, oxygen, silicon, noble metals, lead, bismuth or the like elements are easy to diffuse along columnar grain boundaries. Therefore, a problem has occurred in efforts to attain a sufficient barrier effect, since a layer thickness is required to be equal to or more than 200 nm, which makes a stepwise rise of the dielectric capacitor higher, thereby hindering higher degree of integration. Still further, when the heat treatment temperature is lowered such that the above-mentioned problems are prevented from occurring, different problems occur instead since neither of a sufficient dielectric constant and a sufficient ferroelectricity is achieved, a leakage current increases, together with other poor performance, any of which makes high reliability impossible to attain.

Further, in order to solve the above-mentioned problems, a trial has been conducted in which tantalum nitride silicide (TaSiN) is used as a amorphous diffusion barrier with no grain boundary instead of titanium nitride and iridium is used as a noble metal to improve heat resistance, which is disclosed in J. Kudo et al., IEEE IEDM Technical Digest, p. 609, (1997). In this case, however, a total film thickness of the lower electrode is as thick as 200 nm to 300 nm and on top of this, a heat resistance is limited to the order of 700° C., which is insufficient for a highly integrated FeRAM as with a SBT film.

SUMMARY OF THE INVENTION

The invention relates to a semiconductor memory device and a fabrication method therefor that are provided in order to solve the above-mentioned problems.

The invention is directed to a semiconductor memory device comprising: a dielectric capacitor obtained by stacking a first electrode, a dielectric film and a second electrode; and a conductive plug connected to the first or second electrode of the dielectric capacitor, wherein an electrode of the first and second electrodes, connected to the conductive plug includes a metal suboxide layer with conductiveness and a diffusion barrier layer blocking diffusion of oxygen, and the metal suboxide layer and the diffusion barrier layer are stacked in the order from the conductive plug side of the electrode connected to the conductive plug.

In the above-mentioned semiconductor memory device, an electrode of the first and second electrodes, connected to the conductive plug includes the metal suboxide layer with conductiveness and the diffusion barrier layer blocking diffusion of oxygen and the stacking is conducted in the order of the metal suboxide layer and the diffusion barrier layer, starting from the conductive plug side of the electrode connected to the conductive plug. Hence, although the dielectric film is formed, for example, in a high temperature oxidative atmosphere, the diffusion of oxygen into the metal suboxide layer is blocked by the diffusion barrier layer. Therefore, since oxidation of the metal suboxide layer does not progress any further beyond a state of oxidation when the metal suboxide layer is formed, not only is a reaction between oxygen in the metal suboxide layer and the conductive plug or the like prevented from occurring, but sufficient conductance of the metal suboxide layer can also be retained after the dielectric film is formed. Even when the conductive plug is especially formed with a silicon based material such as polysilicon, no reaction between oxygen in the metal suboxide layer and silicon in the silicon based material occurs and therefore, no silicon oxide is produced, thereby causing no poor conductance.

The invention is directed to a fabrication method for a semiconductor memory device comprising:
a step of forming a contact hole in an interlayer insulation film formed on a substrate and forming a conductive plug in the contact hole;
a step of forming a first electrode connected to the conductive plug on the interlayer insulation film and then stacking a dielectric film and a second electrode on the first electrode to form a dielectric capacitor; and
a step of forming a metal suboxide layer with conductiveness and a diffusion barrier layer blocking diffusion of oxygen starting from a side of the first electrode to which side the conductive plug is connected.

In the above-mentioned fabrication method for a semiconductor memory device, since the metal suboxide layer with conductiveness and the diffusion barrier layer blocking diffusion of oxygen are formed starting from a side of the first electrode constituting the dielectric capacitor to which side the conductive plug is connected, therefore, even if the dielectric film is formed in a high temperature oxidative atmosphere after forming the suboxide layer and the diffusion barrier layer, diffusion of oxygen into the metal suboxide layer is prevented from occurring by the diffusion barrier layer, with the result that the metal suboxide layer is not oxidized any further beyond before formation of the dielectric film and thereby not only is a reaction between oxygen in the metal suboxide film and the conductive plug prevented from occurring, but the metal suboxide layer can retain sufficient conductance after the dielectric film is formed as well. Especially, even when the conductive plug is formed with a silicon based material such as polysilicon, no reaction occurs between oxygen in the metal suboxide layer and silicon in the silicon based material and no silicon oxide film is produced, thereby causing no poor conductance.

Further, as metals for the metal suboxide layer, there are especially selected metals such as titanium, vanadium, chromium, iron and rhenium, free energy of formation of each of whose oxides is smaller than that of silicon oxide and whose oxides have a conductiveness and thereby, not only can oxidation of the conductive plug be prevented from occurring but sufficient conductance thereof is also ensured.

DETAILED DESCRIPTION OF THE PREFERRED EMBODIMENTS

Description will be made of a first embodiment relating to a semiconductor memory device of the invention with reference to a simplified, sectional view of a construction of the device of FIG. 1.

Figure 1:
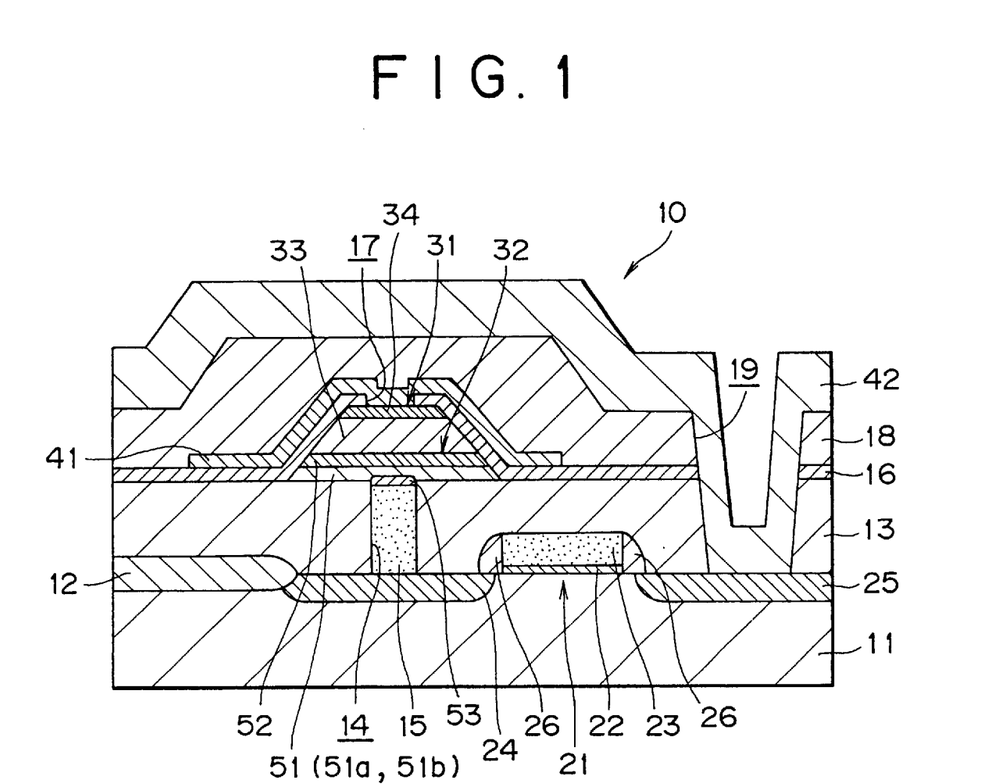
FIG. 1 is a simplified, sectional view schematically showing a construction of a first embodiment relating to a semiconductor memory device of the invention.

As shown in FIG. 1, an inter-element isolation oxide film 12 is formed on a semiconductor substrate 11 of a first conductivity type to isolate element formation regions. In an element formation region, a transistor 21 is formed. The transistor 21 is constructed of a gate oxide film 22 formed on the semiconductor substrate 11, a word line (including a gate electrode) 23 formed on the gate oxide film 22, and impurity diffusion regions 24 and 25 of the first conductivity type and a second conductivity type of an opposite polarity therefrom, formed on respective both sides of the gate electrode portion on the semiconductor substrate 11. The word line 23 is formed with, for example, polysilicon doped with an impurity. A side wall insulation film 26 is formed on a side wall of the word line 23.

An interlayer insulation film 13 covering the transistor 21 is formed on the semiconductor substrate 11. In the interlayer insulation film 13, a contact hole 14 reaching the impurity diffusion region 24 is formed and in the inside of the contact hole 14, there is formed a conductive plug 15 in a memory cell section, connected to the impurity diffusion region 24. The conductive plug 15 is made of, for example, polysilicon doped with an impurity.

On the interlayer insulation film 13, a first electrode (a lower electrode) 32 connected to the conductive plug 15, a dielectric film 33 and a second electrode (an upper electrode) 34, the three of which constitute a dielectric film 31, are stacked in the order. From the conductive plug side 15 of the lower electrode 32, a metal suboxide layer 51 with conductiveness and a diffusion barrier layer 52 blocking diffusion of oxygen are sequentially formed in the order.

The above-mentioned metal suboxide layer 51 is made of a suboxide of at least one selected from the group consisting of, for example, titanium (Ti), vanadium (V), chromium (Cr), manganese (Mn), iron (Fe), cobalt (Co), nickel (Ni), copper (Cu), zinc (Zn), zirconium (Zr), niobium (Nb), tantalum (Ta), molybdenum (Mo), technetium (Te), lanthanum (La), hafnium (Hf), tungsten (W), cerium (Ce), praseodymium (Pr), neodymium (Nd), uranium (U), neptunium (Np), plutonium (Pu), samarium (Sm), europium (Eu), americium (Am), ruthenium (Ru), rhodium (Rh), rhenium (Re), osmium (Os), iridium (Ir), tin (Sn), thallium (Tl), indium (In), lead (Pb) and bismuth (Bi), and the layer 51 not only has a barrier effect against silicon but is also conductive. Among the elements mentioned above, when there is selected, especially, metals such as titanium, vanadium, chromium, iron and rhenium, free energy of formation of each of whose oxides is lower than that of silicon oxide and whose oxides are conductive, not only can oxidation of the conductive plug 15 be prevented from occurring but sufficient conductance thereof can be retained. A metal suboxide here is a metal oxide in which oxygen atoms are contained in a proportion less than expected from an oxidation number of the metal.

Herein, the metal suboxide layer 51 is constructed of two layers of different materials as an example. A first layer 51a of the metal suboxide layer 51 not only has a barrier effect against silicon but is constituted of a metal suboxide layer with conductiveness, while a second layer 51b of the metal suboxide layer 51 is constituted of a noble metal layer including oxygen, which is made of a noble metal material including a transition metal oxide expressed by a chemical formula $M1_a M2_b O_c$, wherein M1 represents at least one noble metal selected from the group consisting of iridium, ruthenium, rhodium, palladium and platinum; M2 at least one transition metal selected from the group consisting of hafnium, tantalum, zirconium, vanadium, molybdenum and tungsten; and a, b, and c contents of respective metals, provided that the following relations are satisfied: $0.4 \leq a \leq 0.9$, $0.02 \leq b \leq 0.15$, $0.04 \leq c$ and $a+b+c=1$. For example, the first layer 51a is made of a suboxide layer $(TiO_x)$ of Titanium and the second layer 51b is made of an iridium-hafnium alloy containing oxygen.

It should be appreciated that a silicide film 53 may be formed at an interface between the conductive plug 15 and the metal suboxide layer 51. The silicide film 53, here, is made of titanium silicide $(TiSi_2)$ as an example.

The diffusion barrier layer 52 is made of, for example, at least one selected from the group consisting of iridium, ruthenium, rhodium, rhenium and osmium, and oxides of iridium, ruthenium, rhodium, rhenium and osmium. The diffusion barrier layer 52 here is made of iridium as an example.

The dielectric film 33 is made of an $ABO_3$ perovskite structure material and for example, includes at least one material selected from the group consisting of materials expressed by chemical formulae of $SrTiO_3$, $(Ba,Sr)TiO_3$, $PbTiO_3$, $Pb(Zr,Ti)O_3$, $(Pb,La)TiO_3$, $(Pb,La)(Zr,Ti)O_3$, $BaTiO_3$, $LiNbO_3$, $LiTaO_3$ and $YMnO_3$. Alternately, the dielectric film 33 is made of a bismuth layered perovskite structure compound and for example, includes at least one material selected from the group consisting of materials expressed by chemical formulae of $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $BaBi_2Ta_2O_9$ and $BaBi_2Nb_2O_9$.

The dielectric capacitor 31 is covered with an interlayer insulation film 16 and a contact hole 17 is formed on the upper electrode 34 of the dielectric capacitor 31. A plate line 41 is provided so as to be connected to the upper electrode 34 through the contact hole 17.

Furthermore, an interlayer insulation film 18 is formed so as to cover the plate line 41. In the interlayer insulation films 18, 16 and 13, a bit contact hole 19 is formed so as to reach the other impurity diffusion region 25 and a bit line 42 is formed so as to be connected the impurity diffusion region 25 through the bit contact hole 19.

In a semiconductor memory device 10 with the dielectric capacitor 31, the lower electrode 32 connected to the conductive plug 15 includes the suboxide layer 51 with conductiveness, a diffusion barrier layer 52 blocking diffusion of oxygen, and the metal suboxide layer 51 and the diffusion barrier layer 52 are sequentially stacked in this order from the conductive plug side of the lower electrode 32. Therefore, for example, even when the dielectric film 33 is formed in a high temperature oxidative atmosphere, diffusion of oxygen into the metal suboxide layer 51 is blocked by the diffusion barrier layer 33. With such conditions, since oxidation of the metal suboxide layer 51 does not progress any more compared to before formation of the dielectric film 33, not only is a reaction of oxygen in the metal suboxide layer 51 with the conductive plug 15 or others prevented from occurring, but the metal suboxide layer 51 can also hold a sufficient conductance after formation of the dielectric film 33 as well. Especially, even when the conductive plug 15 is formed with a silicon based material such as polysilicon, there is no chance of formation of a silicon oxide film through a reaction between oxygen in the metal suboxide film 51 and silicon of the silicon based material, thereby causing no poor conductance.

Further, in the above-mentioned semiconductor memory device, since the conductive plug 15 is used for connection between the transistor (a selection transistor) 21 and the dielectric capacitor 31, a stacked structure can be adopted in which the dielectric capacitor 31 is formed on the transistor 21. Hence, memory cell regions can be contracted so as to enable a higher degree of integration.

In the semiconductor memory device 10 with above-mentioned construction, the metal suboxide layer 51 in use as a diffusion barrier layer has a conductiveness and the contents thereof are in a state of oxidation to an appropriately low extent. An electrode structure in which the metal suboxide layer is covered with the diffusion barrier layer 52 blocking diffusion of oxygen is adopted such that even in a high temperature oxidative atmosphere during formation of the dielectric film 33, the metal suboxide layer 51 is not oxidized any more beyond before the heat treatment in the high temperature oxidative atmosphere. With this structure, not only is a reaction with the conductive plug 15 such as is made of polysilicon or others prevented from occurring but sufficient conductance of the metal suboxide layer is retained after formation of the dielectric film 33 as well.

When, as metals of the metal suboxide layer 51, especially metals such as titanium, vanadium, chromium, iron and rhenium, free energy of formation of each of whose oxides is small and whose oxides are conductive are selected: for example titanium is selected as mentioned above, oxidation of the conductive plug 15 as is made of polysilicon and others can be prevented from occurring and conductance thereof is sufficiently retained. Further, the metal suboxide layer 51 shows a good adhesion to a silicon oxide film, polysilicon and others and there is almost no chance to produce problems such as peeling off of the film due to insufficient adhesion. Besides, an oxygen content in the metal suboxide layer 51 is necessary to be controlled so as to be an appropriate value in order to not only prevent a reaction between the lower electrode 32 and the conductive plug 15 or others from occurring, but make it possible to retain sufficient conductance after formation of the dielectric film 33 as well. That is, when a content of oxygen contained in the metal suboxide layer 51 is excessively low, a reaction with the conductive plug 15 and others is caused. Contrary to this, the content of oxygen is excessively high, conductance becomes poor, thereby increasing contact resistance. In order to keep a proper oxygen content in the metal suboxide layer 51 after formation of the dielectric film 33, it is important that the metal suboxide layer 51 is covered with the diffusion barrier layer 52 against oxygen.

In a case where this structure is adopted, when for example, a titanium oxide ($TiO_{0.6}$), as the metal suboxide layer 51, of 20 nm in thickness is formed on the conductive plug 15 and an iridium film, as the diffusion barrier layer 52 against oxygen, of 20 nm in thickness is formed thereon, there arises neither oxidation of the conductive plug 15 made of polysilicon, a reaction thereof with the electrode nor other adverse phenomena, even after the structure is exposed in an oxygen atmosphere at a temperature as high as of the order ranging 750° C. to 900° C. for 1 hour or longer.

Furthermore, when an iridium film is used as an underlayer of the dielectric film 22, a very good dielectric characteristic is obtained, which is very useful. Therefore, this structure is extraordinarily advantageous in high degree integration of elements since not only a wide range of dielectric films from STO, BSTO and PZT films with a comparatively low temperature of film formation to an SBT film with a high temperature of film formation can be employed, but a stepwise rise in a capacitor region can be suppressed very low.

In addition, in a case where the conductive plug 15 is made of polysilicon, formation of an insulation film or the like film can be restrained by forming the silicide film 53 on the surface of the plug, which makes it possible to realize mass fabrication with excellency in reproducibility and homogeneity.

Further, when the second layer 51b made of a noble metal including a small content of oxygen: an oxygen containing iridium-hafnium alloy is stacked on the first layer 51a constituted of a titanium suboxide layer, a degree of oxidation of titanium can be controlled to an appropriate one. Furthermore, when a noble metal layer including an oxide of a transition metal with a small free energy of formation of its oxide is used, an extent to which oxygen diffuses into the first layer 51a during formation of the dielectric film 33 can more precisely be controlled, whereby an electronic element can be fabricated with more of reproducibility. Properties of noble metal materials including a transition metal oxide are detailed in JP-A-98-242409.

Then, description will be made of an action of a metal in the diffusion barrier layer 52 against oxygen below.

As materials of the oxygen diffusion barrier layer 52, there can be conceived the following conductive nitrides having conventionally been employed as candidates: titanium nitride (TiN), titanium nitride oxide (TiON), tantalum nitride (TaN), tantalum silicide nitride (TaSiN), tungsten nitride (WN) and others. However, when a ferroelectric material is used in the dielectric film 33, the nitrides are not sufficient in terms of heat resistance, while when a high dielectric-constant material such as $Ta_2O_5$, STO or the like material is used, the nitrides have a chance of being useful. Presently, only noble metals and oxides thereof are known as diffusion barrier materials useful even in a case of a ferroelectric material.

As the oxygen diffusion barrier layer 52, the following elements and conductive oxides can be exemplified: as elements, iridium (Ir), ruthenium (Ru), rhodium (Rh), rhenium (Re), osmium (Os) and others; and as conductive oxides, iridium oxide ($IrO_2$), ruthenium oxide ($RuO_2$), rhodium oxide ($RhO_3$), rhenium oxide ($ReO_3$), osmium oxide ($OSO_3$) and others. In a case where such a diffusion barrier layer 52 is used, a structure of the lower electrode is such that the conductive plug 15 made of polysilicon, (the silicide film 53), the metal suboxide layer 51, the buffer layer (not shown), the oxygen diffusion barrier layer 52, the underlayer (not shown) and the dielectric film 33 are stacked in the order from the lowest layer of the lower electrode upward.

First, when a conductive oxide such as iridium oxide ($IrO_2$) is used in the oxygen diffusion barrier layer 52, there is a high possibility for a metal in the metal suboxide layer 51 to fetch oxygen in the conductive oxide since the metal in the metal suboxide layer 51 is easier to be oxidized than a metal in the conductive oxide (since the metal in the metal suboxide is easier to be oxidized than silicon (Si), the metal in the metal suboxide is naturally easier to be oxidized than the metal in the conductive oxide). Hence, the buffer layer (not shown) such as iridium (Ir) is preferably formed between the diffusion barrier layer 52 and the metal suboxide layer 51. Further, it has been known that a leakage current becomes large when the dielectric film 33 is formed direct on the conductive oxide. Therefore, an underlayer (not shown) made of platinum (Pt) or the like is preferably formed beneath the dielectric layer 33.

On the other hand, when iridium (Ir) is used in the diffusion barrier layer 52, the diffusion barrier layer 52 can have an additional double effect as an underlayer and a buffer layer and therefore, the underlayer and buffer layer can be omitted. This is true for cases of other noble metals (for example, ruthenium, rhodium, rhenium and osmium). Accordingly, in the example described using FIG. 1, the buffer layer and underlayer are both omitted.

Further, while platinum (Pt) is most excellent as an underlayer from the angle of properties of a dielectric, there arises a necessity of a stacked structure of platinum and an oxygen diffusion barrier layer since platinum (Pt) does not work as a diffusion barrier against oxygen. However, instead of the stacked structure, a single layer structure may be adopted in which platinum (Pt) is added into the diffusion barrier layer; for example iridium-platinum alloy is formed so as to exert a double effect as an underlayer and a diffusion barrier layer.

It should be appreciated that currently, a layer made of a metal suboxide of either of lead and bismuth is included in a promising ferroelectric material without fail and while it is considered that, for example, lead finally reacts with an underlayer to form an oxide layer such as $Pt_2Pb_2O_7$, which serves as a diffusion barrier layer, a probability thereof will be very low.

Then, description will be given of the first embodiment relating to a fabrication method for a semiconductor memory device of the invention with reference to views of a semiconductor memory device in fabrication process of FIGS. 2A to 2E. In FIGS. 2A to 2E, constituents similar to those described using FIG. 1 are indicated by the same marks as those used in FIG. 1.

Figure 2A:
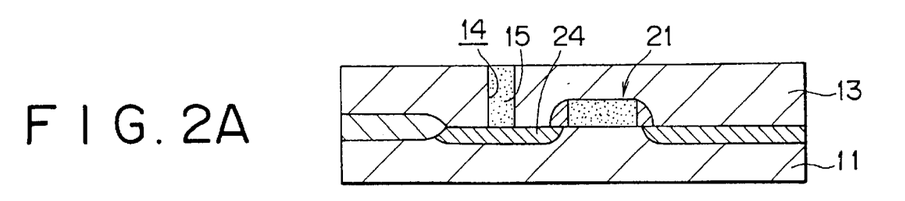
FIGS. 2A to 2E are views of a semiconductor memory device in fabrication process showing the first embodiment relating to a fabrication method for the device of the invention.

As shown in FIG. 2A, first a transistor 21 for switching was fabricated on a semiconductor substrate 11 using a known formation technique for MOSFET and thereafter, an interlayer insulation film 13 covering the transistor 21 was formed on the semiconductor substrate 11 using a known technique. Following this, a contact hole 14 was formed in the insulation film 13 using known techniques of lithography and etching such that the contact hole 14 connected between a capacitor to be formed in a later step and an impurity diffusion region 24 formed in the semiconductor substrate 11. Then, polysilicon diffused with an impurity was filled into the contact hole 14 using a known filling technique, followed by a chemical mechanical polishing (hereinafter referred to as CMP). In CMP, polysilicon in excess on the interlayer insulation film 13 was removed not only to form a conductive plug 15 with residual polysilicon in the contact hole 14, but to planarize the surface of the interlayer insulation film 13 and the top of the conductive plug 15 while being made flush with each other. In this case, a diameter of the conductive plug 15 was 0.4 μm.

Figure 2B:
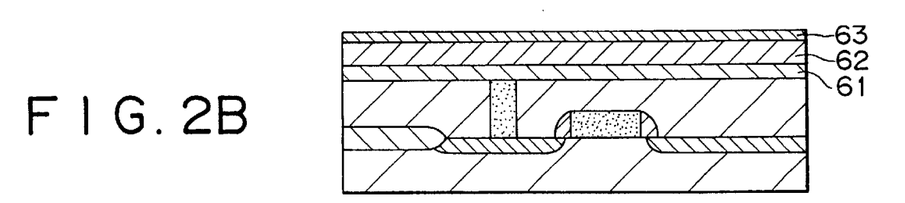

Then, as shown in FIG. 2B, a lower electrode layer 61 was formed on the interlayer insulation film 13 by means of a sputtering method. The lower electrode layer 61 is constructed of three thin layers, that is a titanium (Ti) film, an iridium-hafnium alloy (IrHfO) including oxygen and an iridium (Ir) film, and film formation conditions will be detailed below.

First, after a known SC2 cleaning operation was performed for 10 min, a Ti film was formed to, for example, a thickness of 20 nm by means of a DC sputtering method. The film formation conditions were such that a target was of titanium, an input power was 2 kW, a process gas was argon (Ar) at a feed rate of 40 sccm under a pressure 0.5 Pa of a film formation atmosphere and a substrate temperature was 200° C.

Without exposing the substrate 11 to the air and in succession to formation of the Ti film, an IrHfO film was formed to, for example, of 25 nm using a reactive DC sputtering method. The film formation conditions were such that a target was of iridium-hafnium alloy ($Ir_{94}Hf_6$), an input power was 2 kW, a process gas was argon (Ar) and oxygen ($O_2$) at feed rates of 28.6 sccm and 1.4 sccm, respectively, under a pressure of a film formation atmosphere of 0.2 Pa and a substrate temperature was room temperature. A stoichiometry of a IrHfO film was $Ir_{69.5}Hf_{6.8}O_{23.7}$.

Again, without exposing the substrate 11 to the air and in succession to formation of the IrHfO film, an Ir film was formed to, for example, of 20 nm using a DC sputtering method. The film formation conditions were such that a target was of iridium, an input power was 2 kW, a process gas was argon (Ar) at a feed rate of 30 sccm under a pressure of a film formation atmosphere of 0.2 Pa and a substrate temperature was 200° C.

Then, as a ferroelectric film 62, for example a strontium, bismuth tantalate (hereinafter referred to as SBT, whose chemical formula was expressed by $SrBi_2Ta_2O_9$) thin film was formed on a lower electrode 61 using a chemical solution coating method. First, description will be made of a preparation method for a precursor solution for use in formation of the STB thin film and thereafter of a formation step for the SET thin film using the precursor solution, below.

As starting materials for preparation of a solution, tantalum ethoxide ($Ta(OC_2H_5)_5$), bismuth-2-ethyhexanoate ($Bi(C_7H_{15}COO)_2$), and strontium 2-ethyl hexanoate ($Sr(C_7H_{15}COO)_2$) were used. An amount of tantalum ethoxide was weighed and dissolved into 2-ethlyl hexanoate. In order to accelerate a reaction, the first solution was heated from 100° C. to the maximum 120° C. for 30 min while stirring. After the heating, ethanol and water produced by the reaction at 120° C. was removed. A proper amount of a second solution of strontium 2-ethyl hexanoate in 20 ml to 30 ml xylene was properly added to the first solution such that a metal element compositional ratio Sr/Ta=2/5 and the third solution was heated from 125° C. to the maximum 140° C. for 30 min while stirring. After the second heating, a proper amount of a fourth solution of bismuth 2-ethyl hexanoate in 10 ml xylene was added to the third solution such that a metal element compositional ratio Sr/Bi/Ta=0.8/2.2/2 and the fifth solution is heated from 130° C. to the maximum 150° C. for 10 hr while stirring.

Then, the fifth solution was distilled at temperatures over the range of from 130° C. to 150° C. for 5 hr in order to remove a low molecular weight alcohol, water and xylene which had been added as a solvent. The distillate was filtered with a filter of 0.46 μm in removed particle diameter. Thereafter, an SBT concentration in the filtrate solution was adjusted so as to be 0.1 mol/l to prepare a precursor solution. Starting materials and a preparation method are not limited to the above mentioned materials and method. Further, a solvent is not limited to xylene but any solvent may be used as far as the starting materials are dissolved sufficiently.

Then, a film was formed using the above mentioned precursor solution according to the below mentioned steps.

First, the precursor solution was dropwise fed on a wafer in rotation to coat the solution on the wafer in conditions of a rotation speed of 3000 rpm and a rotation time of 20 sec. Thereafter, in order to completely evaporate the solvent, the wafer was placed on a hot plate heated at 250° C. for 7 min in the air atmosphere, followed by an RTA (Rapid Thermal Annealing) heat treatment in an oxygen atmosphere at 750° C. under an atmospheric pressure for 30 sec. Such a film formation operation was repeated three times and thereafter, as first sintering, in a diffusion furnace, the wafer was subjected to a heat treatment in an oxygen atmosphere at 750° C. under an atmospheric pressure for 60 min to form the dielectric film 62 made of the ferroelectric material of SBT of a thickness of 170 nm.

Then, for example, an iridium layer of 50 nm in thickness as an upper electrode layer 63 was formed by stacking on the dielectric film 62 using a sputtering method at a set substrate temperature of 200° C. during film formation. Following formation of the layer, as second sintering, in a diffusion furnace, the wafer was subjected to a heat treatment in an oxygen atmosphere at 750° C. under an atmospheric pressure for 60 min.

Figure 2C:
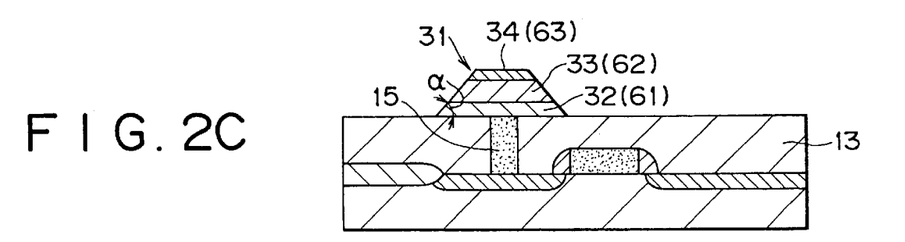

Then, as shown in FIG. 2C, the upper electrode layer 63, SBT dielectric film 62 and lower electrode layer 61 were processed by known techniques of lithography and etching to form, for example, a pattern of 1.0 $\mu$m squares. As a result, a dielectric capacitor (ferroelectric capacitor) 31 was constructed by stacking the lower electrode layer 32 (61) connected to the conductive plug 15, the dielectric film 33 (62) and the upper electrode layer 34 (63) on the interlayer insulation film 13.

In the above-mentioned etching operations, an reactive ion etching apparatus was used and as an etching gas used for the upper electrode layer 63, a mixed gas of argon and chlorine was used, as an etching gas used for the dielectric film 62, a mixed gas of argon and boron trichloride ($BCl_3$) was used and as an etching gas for the lower electrode layer 61, a mixed gas of argon and chlorine was used. A sidewall profile angle • of the ferroelectric capacitor is about 60 degrees and a CD gain is about 0.1 $\mu$m on one side.

Figure 2D:
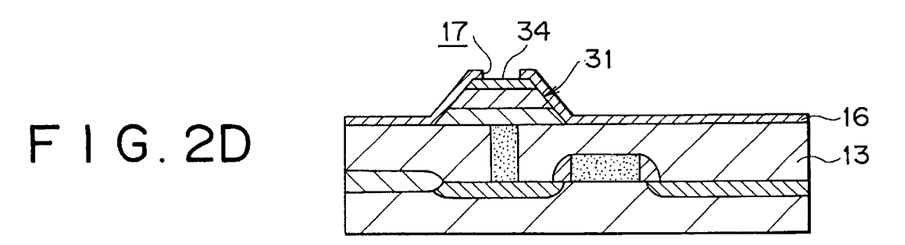

Then, as shown in FIG. 2D, the interlayer insulation film 16 covering the dielectric capacitor 31 was formed on the upper interlayer insulation film 13 by deposition, for example silicon oxide, to a thickness of 150 nm by means of a known CVD method. Following this, a contact hole 17 is formed so as to have a diameter of, for example, 0.4 $\mu$m in the interlayer insulation film 16 on the upper electrode 34 by means of known techniques of lithography and etching.

Figure 2E:
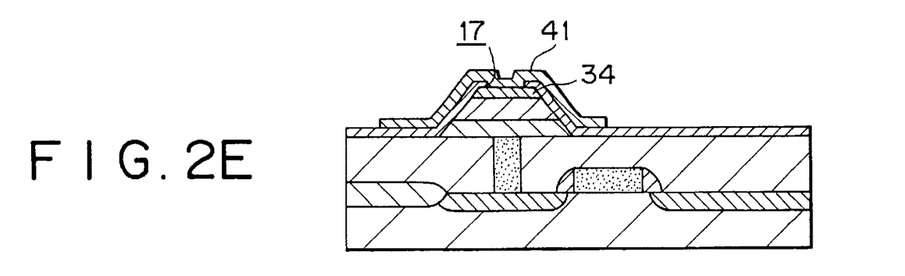

Then, as shown in FIG. 2E, a titanium (Ti) film was formed to a thickness of, for example, 20 nm using a known technique of sputtering and following this, on the titanium film, a titanium oxide nitride (TiON) was formed to a thickness of, for example, 20 nm and on the oxide nitride film, an aluminum-silicon (Al—Si) alloy film was further formed to a thickness of, for example, 600 nm. Subsequent to this, the Ti film, TiON film and Al—Si alloy film were processed to form the plate line 41 connected to the upper electrode 34 through the contact hole 17.

After formation of the plate line 41, as shown in FIG. 1, the bit contact hole 19 was formed in the interlayer insulation films 18, 16 and 13 above the other impurity diffusion region 25 using known techniques of lithography and etching after the interlayer insulation film 18 was formed using a CVD method and planarization was performed on the interlayer insulation film 18. In addition, the bit line 42 was formed using a known aluminum wiring technique to complete the ferroelectric memory cell (of the semiconductor memory device).

Then, the dielectric capacitor (ferroelectric capacitor) 31 on the conductive plug 15 fabricated by the above mentioned method was analyzed on a section thereof.

Figure 3:
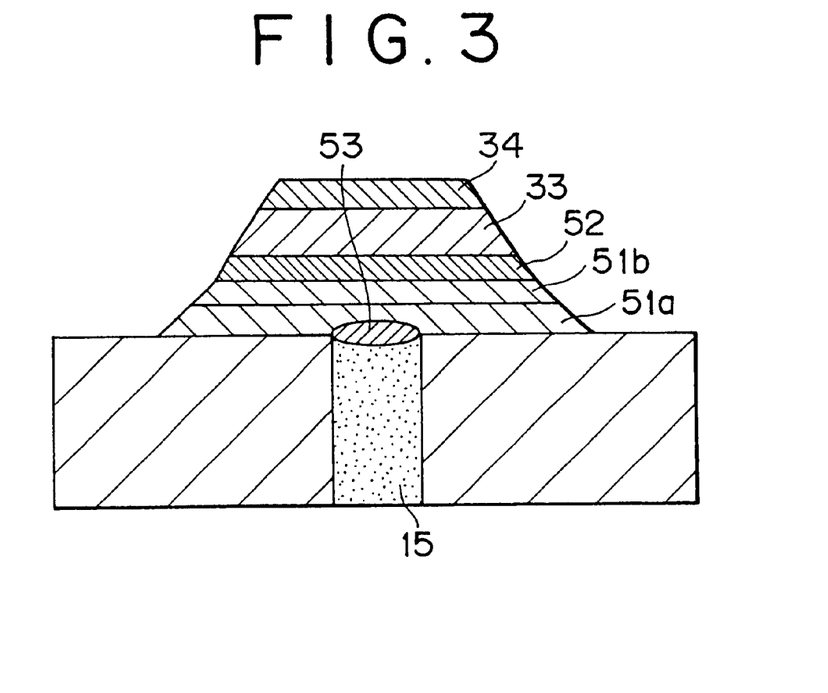
FIG. 3 is a simplified, sectional view of a structure of a dielectric capacitor schematically showing a analytical result obtained with use of a transmission electron microscope.

First, the analysis was conducted using a transmission electron microscope. As shown in FIG. 3, it was observed that a silicide film 53 made of titanium silicide ($TiSi_2$) having a film thickness of the order of 20 nm was formed at the interface with the conductive plug 15 made of polysilicon; on the silicide film 53, there was formed the first layer 51a of about 20 nm in thickness, constituted of a metal suboxide layer made of titanium oxide ($TiO_{0.5}$); on the first layer 51a, there was further formed the second layer 51b of about 25 nm in thickness, constituted of a metal suboxide layer made of $Ir_{85}Hf_9O_6$; and on the second layer 51b, there was formed the oxygen diffusion barrier layer 52 of about 20 nm in thickness, constituted of an Ir layer. It was analyzed from the above mentioned observation that, in the lower electrode layer 32, part of the conductive plug side of the Ti layer was reacted with polysilicon of the conductive plug 15 to form a silicide in the heat treatment of formation of the SBT dielectric film (ferroelectric film) 33 and simultaneously with this, part of the upper side rest of Ti layer was oxidized by oxygen diffused from the IrHfO layer to form a $TiO_{0.5}$ layer. It was further observed that the upper electrode layer 34 made of iridium was formed on the dielectric film 33.

Then, electrical characteristics of the above-mentioned ferroelectric memory cell were measured using a known Sawyer tower circuit. As a result, a hysteresis loop was of a good shape, a residual polarization Pr at an applied voltage of 3 V was 9.9 $\mu C/cm^2$ and a coercive electric field Ec was measured 30 kV/cm at an applied voltage of 0.6 V. Therefore, sufficient performances as a ferroelectric capacitor were confirmed. Further, a leakage current was measured 50 $nA/cm^2$ at an applied voltage of 3 V, by which again a sufficient characteristic as a ferroelectric capacitor was confirmed.

Then, known measurements on fatigue characteristics were conducted. That is, changes in residual polarization Pr according to the number of polarization inversions were measured when a polarization inversion was repeatedly conducted by applying a voltage of 3 V in pulses of 1 MHz in frequency to the ferroelectric capacitor. As a result, there had not been observed any changes in a value of residual polarization Pr even after 200 billion times of polarization inversions, which showed an excellent characteristic as a nonvolatile memory.

In addition, a known 4 terminal Kelvin pattern as disclosed in D. K. Schroder, Semiconductor Material and Device Characterization, Willey-Interscience, New York, (1990) was prepared and a contact resistance between the conductive plug 15 of polysilicon and the lower electrode was measured. As a result, in a case of the conductive plug 15 of polysilicon of 0.4 $\mu$m in diameter, the measured value was about 200$\Omega$, which was found to be sufficiently small for fabrication of a semiconductor memory device with the above mentioned configuration.

Further, for comparison, a second layer (IrHfO layer) 51b in the lower electrode 32 was prepared in the same film formation conditions by means of a reactive DC sputtering method, the conditions being such that an iridium-hafnium alloy ($Ir_{94}Hf_6$) was used as a target, an input power was 2 kW, a mixed gas of argon (Ar) and oxygen ($O_2$) was used as process gas at feed rates of 29.6 sccm and 0.4 sccm, respectively, under a pressure of a film formation atmosphere of 0.2 Pa and a substrate temperature was room temperature.

As a result, a chemical composition of the IrHfO film after formation of a dielectric (ferroelectric) capacitor 31 was as shown in a chemical formula $Ir_{87}Hf_{10}O_3$. In this case, silicon penetrated through a first layer 51a made of $TiO_x$ to intrude into a second layer 51b constituted of the IrHfO film, thereby causing silicidation. This is estimated because an oxygen content included in the IrHfO film is low and therefore, sufficient oxidation of the Ti layer was not achieved, which made it impossible to suppress a reaction with the conductive plug of polysilicon. In this case, as well, however, there is a case where a dielectric capacitor thus fabricated can be used as an element if intrusion of silicon is stopped within the second layer 51b constituted of the IrHfO film and no influence is exerted on a STB dielectric (ferroelectric) film 33.

It should be appreciated that while in the above description of the first embodiment, SBT was used as a material of a ferroelectric film, there is no specific limitation to SBT in the invention but other ferroelectric materials and high dielectric-constant materials which are describe above can be used instead. Further, information for the dielectric film 33, other methods than the chemical solution coating method can be employed, such as a MOCVD method, a sputtering method, a vapor deposition method and others.

Then, description will be made of the second embodiment relating to a semiconductor memory device of the invention, below.

In the second embodiment, a construction or structure and a fabrication method are the same as those described in the first embodiment except for the structure of a lower electrode 32 and a formation method therefor only.

Therefore, description here will be made of the fabrication method for the lower electrode and its structure.

First, after a known SC2 cleaning was applied to a wafer for 10 min, a cobalt silicide ($CoSi_2$) film was formed on only the surface of a conductive plug of polysilicon to a thickness of, for example, 20 nm by a known cobalt silicide technique. The $CoSi_2$ film corresponds to the silicide film 53 in the first embodiment.

Description will be made of an example of the formation method below: For example, after a cobalt (Co) film was formed to a thickness of, for example, 10 nm by a known DC sputtering method, in succession to this, a titanium (Ti) film was formed to a thickness of 20 nm. Then, a RTA heat treatment was applied to the wafer in a nitrogen atmosphere at 550° C. for 30 sec to react polysilicon with cobalt and form a cobalt silicide. After formation of the silicide, a known aqueous ammonia/hydrogen peroxide solution was used to clean the wafer for 10 min, followed by aqueous sulfuric acid/hydrogen peroxide solution to clean the wafer for 3 min, so that only the Ti layer and the non-reacted cobalt layer were removed. Again, an RTA heat treatment was applied to the wafer having been cleaned in a nitrogen atmosphere at 700° C. for 30 sec. As a result, a cobalt silicide ($CoSi_2$) film was formed on only the surface of the conductive plug of polysilicon.

Then, a metal suboxide layer constituted of a titanium suboxide ($TiO_x$) was formed to a thickness of, for example, 20 nm by means of a DC sputtering method in conditions that titanium was used as a target, an input power was 2 kW, a mixed gas of argon (Ar) and oxygen ($O_2$) was used as process gas at feed rates of 29.0 sccm and 1.0 sccm, respectively, under a pressure of a film formation atmosphere of 0.2 Pa and a substrate temperature was 200° C. A chemical composition of the $TiO_x$ film formed in the conditions was as in a formula $Ti_{40.5}O_{59.5}$.

Without exposure to the air atmosphere and in succession to formation of the $TiO_x$ film, an oxygen diffusion barrier layer made of iridium was formed to a thickness of, for example, 20 nm by means of a reactive DC sputtering method in conditions that iridium was used as a target, an input power was 2 kW, argon (Ar) was used as process gas at a feed rate of 30 sccm under a pressure of a film formation atmosphere of 0.2 Pa and a substrate temperature was 200° C.

Then, an upper electrode layer was formed according to the same formation method as described in the first embodiment. Thereafter, the upper electrode layer, dielectric film and lower electrode layer were processed according to known techniques of lithography and etching to form a dielectric capacitor.

The lower electrode of this structure had neither mutual diffusion of elements between the layers nor a compositional change in formation of an SBT ferroelectric film and a contact resistance between a polysilicon plug and the lower electrode was as good a value as of about 200Ω.

Then, description will be made of the third embodiment relating to a semiconductor memory device of the invention below. In the third embodiment, the configuration or structure of the device and the fabrication method therefor are the same as those described in the first embodiment except for the structure of a lower electrode 32 and a formation method therefor.

Therefore, description here will be made of the formation method for the lower electrode.

First, after a known SC2 cleaning was applied to a wafer for 10 min, a titanium silicide ($TiSi_2$) film was formed on only the surface of a conductive plug of polysilicon to a thickness of, for example, 20 nm by means of a known titanium silicide technique. The $TiSi_2$ film corresponds to the silicide film 53 in the first embodiment. The formation method, as an example, was as follows: After a titanium (Ti) film was formed to a thickness of, for example, 10 nm by means of a known DC sputtering method, and a heat treatment was applied to the wafer in a nitrogen atmosphere at 650° C. for 30 sec to react polysilicon with titanium and form a titanium silicide. After formation of the silicide, a known aqueous ammonia/hydrogen peroxide solution was used to clean the wafer for 10 min, so that only the non-reacted Ti layer was removed. Again, an RTA heat treatment was applied to the wafer having been cleaned in a nitrogen atmosphere at 800° C. for 30 sec. As a result, a titanium silicide ($TiSi_2$) film was formed on only the surface of the conductive plug.

Then, a metal suboxide layer constituted of a titanium suboxide ($TiO_x$) was formed to a thickness of, for example, 20 nm by means of a DC sputtering method in conditions that titanium was used as a target, an input power was 2 kW, a mixed gas of argon (Ar) and oxygen ($O_2$) was used as process gas at feed rates of 29.0 sccm and 1.0 sccm, respectively, under a pressure of a film formation atmosphere of 0.2 pa and a substrate temperature of 200° C. A chemical composition of the $TiO_x$ film was as in a formula $Ti_{40.5}O_{59.5}$.

Without exposure to the air atmosphere and in succession to formation of the $TiO_x$ film, an oxygen diffusion barrier layer made of iridium was formed to a thickness of, for example, 20 nm by means of a reactive DC sputtering method in conditions that iridium was used as a target, an input power was 2 kW, argon (Ar) was used as process gas at a feed rate of 30 sccm under a pressure of a film formation atmosphere of 0.2 pa and a substrate temperature was 200° C.

Then, an upper electrode layer was formed according to the same formation method as described in the first embodiment. Thereafter, the upper electrode layer, dielectric film and lower electrode layer were processed according to known techniques of lithography and etching to form a dielectric capacitor.

The lower electrode of this structure had neither mutual diffusion of elements between the layers nor a compositional change in formation of an SBT ferroelectric film and a contact resistance between a polysilicon plug and the lower electrode was as good a value as of about 200Ω.

Then, description will be made of the fourth embodiment relating to a semiconductor memory device of the invention below. In the fourth embodiment, a configuration or structure of the device and a fabrication method therefor are the same as those described in the first embodiment except for a structure of a lower electrode 32 and a formation method therefor.

Therefore, description here will be made of the formation method for the lower electrode.

First, after a known SC2 cleaning was applied to a wafer for 10 min, a titanium (Ti) film was formed to a thickness of, for example, 5 nm to 20 nm and preferably, to 10 nm by means of a known DC sputtering method. Then, a titanium suboxide ($TiO_x$) serving as a metal suboxide layer was formed to a thickness of, for example, 20 nm by means of a DC sputtering method in conditions that titanium was used as a target, an input power was 2 kW, a mixed gas of argon (Ar) and oxygen ($O_2$) was used as process gas at feed rates of 29.0 sccm and 1.0 sccm, respectively, under a pressure of a film formation atmosphere of 0.2 Pa and a substrate temperature was 200° C. A chemical composition of the $TiO_x$ film was as in a formula $Ti_{40.5}O_{59.5}$.

Without exposure to the air atmosphere and in succession to formation of the $TiO_x$ film, an iridium (Ir) film serving as an oxygen diffusion barrier layer was formed to a thickness of, for example, 20 nm by means of a reactive DC sputtering method in conditions that iridium was used as a target, an input power was 2 kW, argon (Ar) was used as process gas at a feed rate of 30 sccm under a pressure of a film formation atmosphere of 0.2 Pa and a substrate temperature was 200° C.

Then, a dielectric film and upper electrode layer was formed according to the same fabrication method as described in the first embodiment. Thereafter, the upper electrode layer, dielectric film and lower electrode layer were processed according to known techniques of lithography and etching to form a dielectric capacitor. It should be appreciated that in a heat treatment forming the dielectric film, the titanium film and silicon of the conductive plug were reacted with each other to form a titanium silicide film.

The lower electrode of this structure had neither mutual diffusion of elements between the layers nor a compositional change in formation of the dielectric capacitor and a contact resistance between the conductive plug made of polysilicon and the lower electrode showed a good value.

Then, description will be made of the fifth embodiment relating to a semiconductor memory device of the invention below. In the fifth embodiment, the configuration or structure of the device and a fabrication method therefor are the same as those described in the first embodiment except for the structure of a lower electrode 32 and a formation method therefor.

Therefore, description here will be made of the fabrication method for the lower electrode.

First, the surface of a conductive plug made of polysilicon was etched back by about 20 nm by means of a known polysilicon etching back technique to lower the surface of a conductive plug. Then, a titanium (Ti) film was formed to a thickness of, for example, 30 nm by means of a known DC sputtering method. Thereafter, the surface of the titanium film was planarized by means of a known CMP method to form a structure in which the Ti film was embedded in the surface of the conductive plug.

Then, an oxygen containing iridium-hafnium alloy (IrHfO) film serving as a metal suboxide layer was formed to a thickness of, for example, 25 nm by means of a DC sputtering method in conditions that an iridium-hafnium alloy ($Ir_{94}Hf_6$) was used as a target, an input power was 2 kW, a mixed gas of argon (Ar) and oxygen ($O_2$) was used as process gas at feed rates of 28.6 sccm and 1.4 sccm, respectively, under a pressure of a film formation atmosphere of 0.2 Pa and a substrate temperature was room temperature. A chemical composition of the IrHfO film formed in the same conditions as in this embodiment was as in a formula $Ir_{69.5}Hf_{6.8}O_{23.7}$.

Without exposure to the air atmosphere and in succession to formation of the IrHfO film, an iridium (Ir) film serving as an oxygen diffusion barrier layer was formed to a thickness of, for example, 20 nm by means of a DC sputtering method in conditions that iridium was used as a target, an input power was 2 kW, argon (Ar) was used as process gas at a feed rate of 30 sccm under a pressure of a film formation atmosphere of 0.2 Pa and a substrate temperature was 200° C.

Figure 4:
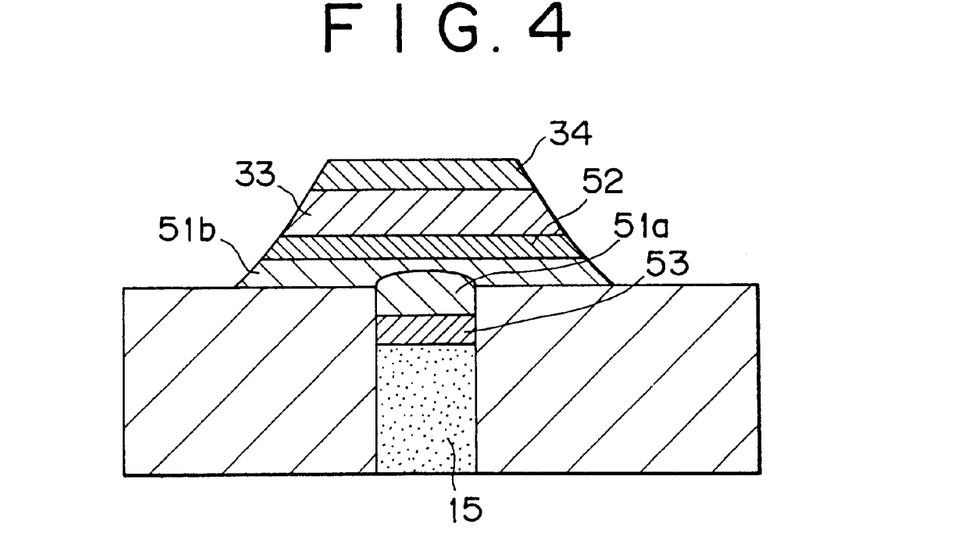
FIG. 4 is a simplified, sectional view schematically showing a construction of a fifth embodiment relating to a semiconductor memory device of the invention.

In the lower electrode of this structure, as shown in FIG. 4, it was observed that a silicide film 53 of 20 nm in thickness, made of titanium silicide ($TiSi_2$) was formed at the interface with a conductive plug 15 made of polysilicon after a SBT ferroelectric film was formed; on the silicide film 53, a first layer 51a of the metal suboxide layer of 20 nm in thickness, made of $TiO_{0.5}$ was formed; on the first layer 51a, a second layer 51b of the metal suboxide layer of 25 nm in thickness, made of $Ir_{85}Hf_9O_6$ was formed; and furthermore, on the second layer 51b, the diffusion barrier layer 52 against oxygen of 20 nm in thickness, made of iridium (Ir) was formed. Therefore, it was analyzed from the above mentioned observation that in the lower electrode 32, part of the conductive plug 15 side of the Ti film reacted with polysilicon of the conductive plug 15 to form the silicide film 53 in the heat treatment during which the SBT dielectric (ferroelectric) film 33 was formed and simultaneously with this, part of the upper side rest of Ti film was oxidized by oxygen diffused from the IrHfO layer to form the first layer 51a of the metal suboxide layer made of $TiO_{0.5}$ layer. An upper electrode layer 34 was formed on a dielectric film 33.

The lower electrode of this structure had neither mutual diffusion of elements between the layers nor a compositional change in formation of the dielectric capacitor 31 and a contact resistance between the conductive plug 15 made of polysilicon and the lower electrode 32 showed a good value.

Then, description will be made of the sixth embodiment relating to a semiconductor memory device of the invention below. In the sixth embodiment, the configuration or structure of the device and a fabrication method therefor are the same as those described in the first embodiment except for the structure of a lower electrode 32 and a formation method therefor.

Therefore, description here will be made of the formation method for the lower electrode.

First, the surface of a conductive plug made of polysilicon was etched back by about 10 nm by means of a known polysilicon etching back technique to lower the surface of the conductive plug. Then, a titanium (Ti) film was formed to a thickness of, for example, 30 nm by means of a known DC sputtering method. Thereafter, the surface of the titanium film was planarized by a known CMP method to form a structure in which the Ti film was embedded in the surface of the conductive plug.

Then, a titanium oxide (TiO$_x$) film serving as a metal suboxide layer was formed to a thickness of, for example, 20 nm by means of a DC sputtering method in conditions that titanium was used as a target, an input power was 2 kW, a mixed gas of argon (Ar) and oxygen (O$_2$) was used as process gas at feed rates of 29.0 sccm and 1.0 sccm, respectively, under a pressure of a film formation atmosphere of 0.2 Pa and a substrate temperature was 200° C. A chemical composition of the TiO$_x$ film formed in the same condition as in this embodiment was as in a formula Ti$_{40.5}$O$_{59.5}$.

Without exposure to the air atmosphere and in succession to formation of the TiO$_x$ film, an iridium (Ir) film serving as an oxygen diffusion barrier layer was formed to a thickness of, for example, 20 nm by means of a DC sputtering method in conditions that iridium was used as a target, an input power was 2 kW, argon (Ar) was used as process gas at a feed rate of 30 sccm under a pressure of a film formation atmosphere of 0.2 Pa and a substrate temperature was 200° C.

Then, a dielectric film and upper electrode layer was formed according to the same fabrication method as described in the first embodiment. Thereafter, the upper electrode layer, dielectric film and lower electrode layer were processed according to known techniques of lithography and etching to form a dielectric capacitor. It should be appreciated that in a heat treatment forming the dielectric film, the titanium film and silicon of a conductive plug were reacted with each other to form a titanium silicide film.

The lower electrode of this structure had neither mutual diffusion of elements between the layers nor a compositional change in formation of the dielectric capacitor and a contact resistance between the conductive plug made of polysilicon and the lower electrode showed a good value.

Then, description will be made of the seventh embodiment relating to a semiconductor memory device of the invention, below. In the seventh embodiment, the configuration or structure of the device and a fabrication method therefor are the same as those described in the first embodiment except for the structure of a lower electrode and a formation method therefor.

Therefore, description here will be made of the formation method for the lower electrode.

First, after a known SC2 cleaning was applied to a wafer for 10 min, a titanium (Ti) film was formed to a thickness of, for example, 20 nm by a known DC sputtering method.

Without exposure to the air atmosphere and in succession to formation of the titanium (Ti) film, an oxygen containing iridium (IrO) film serving as a metal suboxide layer was formed to a thickness of, for example, 25 nm by means of a DC sputtering method in conditions that iridium was used as a target, an input power was 2 kW, a mixed gas of argon (Ar) and oxygen (O$_2$) was used as process gas at feed rates of 22.0 sccm and 8.0 sccm, respectively, under a pressure of a film formation atmosphere of 0.2 Pa and a substrate temperature was 200° C. A chemical composition of the IrO film formed in the same condition as in this embodiment was as in a formula Ir$_{65.0}$O$_{35.0}$.

Again, without exposure to the air atmosphere and in succession to formation of the IrO film, an iridium (Ir) film serving as an oxygen diffusion barrier layer was formed to a thickness of, for example, 20 nm by means of a DC sputtering method in conditions that iridium was used as a target, an input power was 2 kW, argon (Ar) was used as process gas at a feed rate of 30 sccm under a pressure of a film formation atmosphere of 0.2 Pa and a substrate temperature was 200° C.

Then, a dielectric film and upper electrode layer was formed according to the same fabrication method as described in the first embodiment. Thereafter, the upper electrode layer, dielectric film and lower electrode layer were processed according to known techniques of lithography and etching to form a dielectric capacitor. It should be appreciated that in a heat treatment forming the dielectric film, a lower layer of the titanium film and silicon of the conductive plug were reacted with each other to form a titanium silicide film and simultaneously with this, the rest of the titanium film and the IrO film were reacted with each other to form a TiO$_x$ film serving as a first layer of the metal suboxide layer.

The lower electrode of this structure had neither mutual diffusion of elements between the layers nor a compositional change in formation of the dielectric capacitor either and a contact resistance between the conductive plug made of polysilicon and the lower electrode showed a good value.

Further, in the above mentioned embodiments, silicides as shown in Table 1 can be used as the silicide films to be formed at the interfaces between the conductive plugs and the lower electrodes. Of silicides shown in each cell of Table 1, however, a silicide at the leftmost position is the most stable form.

TABLE 1

| | |
|---|---|
| titanium silicide | TiSi$_2$, TiSi, Ti$_5$Si$_3$, TiSi$_3$ |
| vanadium silicide | VSi$_2$, V$_5$Si$_3$, V$_3$Si |
| chromium silicide | CrSi$_2$, CrSi, Cr$_5$Si$_3$, Cr$_3$Si |
| manganese silicide | MnSi$_2$, MnSi, Mn$_5$Si$_3$, Mn$_3$Si |
| iron silicide | FeSi$_2$, FeSi, Fe$_5$Si$_3$, Fe$_3$Si |
| cobalt silicide | CoSi$_2$, CoSi, Co$_2$Si, Co$_3$Si |
| nickel silicide | NiSi$_2$, NiSi, Ni$_3$Si$_2$, Ni$_5$Si$_2$, Ni$_2$Si, Ni$_3$Si |
| zirconium silicide | ZrSi$_2$, ZrSi, Zr$_6$Si$_3$, Zr$_3$Si$_2$, Zr$_2$Si, Zr$_4$Si |
| niobium silicide | NbSi$_2$, Nb$_5$Si$_3$, Nb$_4$Si |
| molybdenum silicide | MoSi$_2$, Mo$_3$Si$_2$, Mo$_5$Si$_3$, Mo$_3$Si |
| ruthenium silicide | Ru$_2$Si$_3$, RuSi, Ru$_2$Si |
| rhodium silicide | Rh$_2$Si$_3$, RhSi, Rh$_3$Si$_2$, Rh$_5$Si$_3$, Rh$_2$Si |
| palladium silicide | PdSi, Pd$_2$Si, Pd$_3$Si |
| hafnium silicide | HfSi$_2$, HfSi, Hf$_3$Si$_2$, Hf$_5$Si$_2$, Hf$_2$Si |
| tantalum silicide | TaSi$_2$, Ta$_5$Si$_3$, Ta$_2$Si, Ta$_4$Si$_5$ |
| tungsten silicide | WSi$_2$, W$_5$Si$_3$, W$_3$Si |
| rhenium silicide | ReSi$_2$, ReSi, Re$_5$Si$_3$, Re$_3$Si |
| osmium silicide | OsSi$_3$, OsSi$_2$, OsSi |
| iridium silicide | IrSi$_3$, IrSi, Ir$_3$Si$_2$, Ir$_2$Si, Ir$_3$Si |
| platinum silicide | PtSi, Pt$_2$Si, Pt$_3$Si |

According to a semiconductor memory device of the invention as mentioned above, since an electrode of first and second electrodes, connected to a conductive plug includes a metal suboxide layer with conductiveness and a diffusion barrier layer blocking diffusion of oxygen and further has a stacked structure in which the metal suboxide layer and diffusion barrier layer are arranged in this order from the conductive plug side of the electrode connected to the conductive plug, therefore diffusion of oxygen into the metal suboxide layer from above the electrode including the metal suboxide layer can be blocked. Therefore, the metal suboxide layer is not oxidized any more after its formation, so that not only can a reaction between oxygen in the metal suboxide layer and a conductive plug or others be blocked, but the metal suboxide layer can retain sufficient conductance. Further, there is no chance that oxygen in the metal suboxide layer and the conductive plug are reacted with each other to form an insulating oxide film, thereby causing no poor conductance due to an oxide film. Therefore, according to a semiconductor memory device of the invention, there can be provided an electrode structure that shows good adhesion to the conductive plug and others, and an excellent barrier effect together with high reliability.

Further, according to a fabrication method for a semiconductor memory device of the invention, since a metal suboxide layer with conductiveness and a diffusion barrier layer blocking diffusion of oxygen are formed in the order starting from a side of the first electrode to which side the conductive plug is connected, diffusion of oxygen into the metal suboxide layer can be blocked by the diffusion barrier layer even when a dielectric film is formed in a high temperature atmosphere after formation of the metal suboxide layer. For this reason, oxidation in the metal suboxide layer does not progress any more after its formation, which in turn can not only prevent a reaction between oxygen in the metal suboxide layer and the conductive plug from occurring, but retain a sufficient barrier effect of the metal suboxide layer and a sufficient conductance thereof even after formation of an dielectric film. Therefore, a fabrication method for a semiconductor memory device of the invention is very useful and in the semiconductor memory device obtained by this fabrication method, even when the conductive plug is formed with silicon based material, there is no chance to suffer poor conductance due to an insulation film to be otherwise produced, which results in an electrode structure showing not only high reliability but good contact characteristics.

What is claimed is:

1. A semiconductor memory device, comprising:
   a dielectric capacitor obtained by stacking a first electrode, a dielectric film and a second electrode; and
   a conductive plug connected to one of the first or second electrodes of the dielectric capacitor,
   wherein the one of the first and second electrodes includes a metal suboxide layer with conductiveness and a diffusion barrier layer blocking diffusion of oxygen, and the metal suboxide layer is a vanadium suboxide layer.

2. The semiconductor memory device according to claim 1, wherein the metal suboxide layer and the diffusion barrier layer are stacked in the order from a conductive plug side of the one electrode connected to the conductive plug.

3. The semiconductor memory device according to claim 1, wherein the metal suboxide layer has a barrier effect against silicon.

4. The semiconductor memory device according to claim 1, wherein the diffusion barrier layer is made of at least one selected from the group consisting of iridium, ruthenium, rhodium, rhenium and osmium, and oxides of iridium, ruthenium, rhodium, rhenium and osmium.

5. The semiconductor memory device according to claim 1, wherein the conductive plug is made of impurity doped polysilicon and a silicide film is formed at a contact interface of the conductive plug with the electrode connected to the conductive plug.

6. The semiconductor memory device according to claim 1, wherein the dielectric film is made of an $ABO_3$ perovskite structure compound.

7. The semiconductor memory device according to claim 2, wherein the dielectric film includes at least one material selected from the group consisting of materials expressed by chemical formulae of $SrTiO_3$, $(Ba,Sr)TiO_3$, $PbTiO_3$, $Pb(Zr,Ti)O_3$, $(Pb,La)TiO_3$, $(Pb,La)(Zr,Ti)O_3$, $BaTiO_3$, $LiNbO_3$, $LiTaO_3$ and $YMnO_3$.

8. The semiconductor memory device according to claim 1, wherein the dielectric film is made of a bismuth layered perovskite structure compound.

9. The semiconductor memory device according to claim 8, wherein the dielectric film includes at least one material selected from the group consisting of materials expressed by chemical formulae of $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $BaBi_2Ta_2O_9$ and $BaBi_2Nb_2O_9$.

10. The semiconductor memory device according to claim 1, wherein the metal suboxide layer is constructed of a first layer and a second layer of different materials, the first layer is the vanadium suboxide layer having a barrier effect against silicon and having conductiveness, the second layer of the metal suboxide layer comprises a noble metal layer that includes oxygen and at least one noble metal selected from the group consisting of iridium, ruthenium, rhodium, rhenium, osmium, palladium and platinum.

11. The semiconductor memory device according to claim 10, wherein the noble metal layer includes a transition metal selected from the group consisting of hafnium, tantalum, zirconium, vanadium, molybdenum and tungsten and has a composition expressed by a chemical formula $M1_aM2_bO_c$, wherein M1 represents the noble metal; M2 represents the transition metal, and O represents Oxygen, and a, b, and c represent contents of respective metals, provided that the following relations are satisfied: $0.4 < a < 0.9$, $0.02 < b < 0.15$, $0.04 < c$ and $a+b+c=1$.

12. A semiconductor memory device, comprising:
   a dielectric capacitor obtained by stacking a first electrode, a dielectric film and a second electrode; and
   a conductive plug connected to one of the first or second electrodes of the dielectric capacitor,
   wherein the one of the first and second electrodes includes a metal suboxide layer with conductiveness and a diffusion barrier layer blocking diffusion of oxygen, and
   wherein the diffusion barrier layer is made of at least one selected from the group consisting of iridium, ruthenium, rhodium, rhenium and osmium, and oxides of iridium, ruthenium, rhodium, rhenium and osmium.

13. The semiconductor memory device according to claim 12, wherein the metal suboxide layer and the diffusion barrier layer are stacked in the order from a conductive plug side of the one electrode connected to the conductive plug.

14. The semiconductor memory device according to claim 12, wherein the metal suboxide/layer has a barrier effect against silicon.

15. The semiconductor memory device according to claim 12, wherein the metal suboxide layer is a vanadium suboxide layer.

16. The semiconductor memory device according to claim 12, wherein the conductive plug is made of impurity doped polysilicon and a silicide film is formed at a contact interface of the conductive plug with the electrode connected to the conductive plug.

17. The semiconductor memory device according to claim 12, wherein the dielectric film is made of an $ABO_3$ perovskite structure compound.

18. The semiconductor memory device according to claim 17, wherein the dielectric film includes at least one material selected from the group consisting of materials expressed by chemical formulae of $SrTiO_3$, $(Ba,Sr)TiO_3$, $PbTiO_3$, $Pb(Zr,$ Ti)O$_3$, (Pb,La)TiO$_3$, (Pb,La)(Zr,Ti)O$_3$, BaTiO$_3$, LiNbO$_3$, LiTaO$_3$ and YMnO$_3$.

19. The semiconductor memory device according to claim 12, wherein the dielectric film is made of a bismuth layered perovskite structure compound.

20. The semiconductor memory device according to claim 19, wherein the dielectric film includes at least one material selected from the group consisting of materials expressed by chemical formulae of SrBi$_2$Ta$_2$O$_9$, SrBi$_2$Nb$_2$O$_9$, SrBi$_2$(Ta, Nb)$_2$O$_9$, Bi$_4$Ti$_3$O$_{12}$, SrBi$_4$Ti$_4$O$_{15}$, SrBi$_4$(Ti,Zr)$_4$O$_{15}$, BaBi$_2$Ta$_2$O$_9$ and BaBi$_2$Nb$_2$O$_9$.

21. The semiconductor memory device according to claim 12, wherein the metal suboxide layer is constructed of a first layer and a second layer of different materials, the first layer includes the metal selected from the group consisting of vanadium, chromium, iron, and rhenium such that the first layer has a barrier effect against silicon and has conductiveness, the second layer of the metal suboxide layer comprises a noble metal layer that includes oxygen and at least one noble metal selected from the group consisting of iridium, ruthenium, rhodium, rhenium, osmium, palladium and platinum.

22. The semiconductor memory device according to claim 21, wherein the noble metal layer includes a transition metal selected from the group consisting of haffium, tantalum, zirconium, vanadium, molybdenum and tungsten and has a composition expressed by a chemical formula M1aM2bOc, wherein M1 represents the noble metal; M2 represents the transition metal, and O, represents Oxygen, and a, b, and c represent contents of respective metals, provided that the following relations are satisfied: $0.4 < a < 0.9$, $0.02 < b < 0.15$, $0.04 < c$ and $a+b+c=1$.

23. A semiconductor memory device, comprising:
a dielectric capacitor obtained by stacking a first electrode, a dielectric film and a second electrode; and
a conductive plug connected to one of the first or second electrodes of the dielectric capacitor,
wherein the one of the first and second electrodes includes a metal suboxide layer with conductiveness and a diffusion barrier layer blocking diffusion of oxygen, and
wherein the metal suboxide layer includes a first layer and a second layer of different materials, the first layer of the metal suboxide layer has a barrier effect against silicon and has conductiveness, the second layer of the metal suboxide layer comprises a noble metal layer including oxygen.

24. The semiconductor memory device according to claim 23, wherein the first layer of the metal suboxide layer is a titanium suboxide layer.

25. The semiconductor memory device according to claim 23, wherein the noble metal layer includes a transition metal selected from the group consisting of hafnium, tantalum, zirconium, vanadium, molybdenum and tungsten and has a composition expressed by a chemical formula M1aM1bOc, wherein M1 represents a noble metal; M2 represents the transition metal, and a, b, and c represent contents of respective metals, provided that the following relations are satisfied: $0.4 < a < 0.9$, $0.02 < b < 0.15$, $0.04 < c$ and $a+b+c=1$.

26. The semiconductor memory device according to claim 23, wherein the metal suboxide layer and the diffusion barrier layer are stacked in the order from a conductive plug side of the electrode connected to the conductive plug.

27. The semiconductor memory device according to claim 23, wherein the metal suboxide layer includes at least one kind of metal a free energy of formation of whose oxide is smaller than that of silicon oxide.

28. The semiconductor memory device according to claim 23, wherein the first layer of the metal suboxide layer is a titanium suboxide layer.

29. The semiconductor memory device according to claim 23, wherein the first layer of the metal suboxide layer is a vanadium suboxide layer.

30. The semiconductor memory device according to claim 23, wherein the diffusion barrier layer is made of at least one selected from the group consisting of iridium, ruthenium, rhodium, rhenium and osmium, and oxides of iridium, ruthenium, rhodium, rhenium and osmium.

31. The semiconductor memory device according to claim 23, wherein the conductive plug is made of impurity doped polysilicon and a silicide film is formed at a contact interface of the conductive plug with the electrode connected to the conductive plug.

32. The semiconductor memory device according to claim 23, wherein the dielectric film is made of an ABO$_3$ perovskite structure compound.

33. The semiconductor memory device according to claim 32, wherein the dielectric film includes at least one material selected from the group consisting of materials expressed by chemical formulae of SrTiO$_3$, (Ba,Sr)TiO$_3$, PbTiO$_3$, Pb(Zr, Ti)O$_3$, (Pb,La)TiO$_3$, (Pb,La)(Zr,Ti)O$_3$, BaTiO$_3$, LiNbO$_3$, LiTaO$_3$ and YMnO$_3$.

34. The semiconductor memory device according to claim 23, wherein the dielectric film is made of a bismuth layered perovskite structure compound.

35. The semiconductor memory device according to claim 34, wherein the dielectric film includes at least one material selected from the group consisting of materials expressed by chemical formulae of SrBi$_2$Ta$_2$O$_9$, SrBi$_2$Nb$_2$O$_9$, SrBi$_2$(Ta, Nb)$_2$O$_9$, Bi$_4$Ti$_3$O$_{12}$, SrBi$_4$Ti$_4$O$_{15}$, SrBi$_4$(Ti,Zr)$_4$O$_{15}$, BaBi$_2$Ta$_2$O$_9$ and BaBi$_2$Nb$_2$O$_9$.

36. The semiconductor memory device according to claim 23, wherein the noble metal layer includes at least one noble metal selected from the group consisting of iridium, ruthenium, rhodium, rhenium, osmium, palladium and platinum.

37. A semiconductor memory device comprising:
a dielectric capacitor obtained by stacking a first electrode, a dielectric film and a second electrode; and
a conductive plug connected to one of the first or second electrodes of the dielectric capacitor,
wherein the one of the first and second electrodes includes a metal suboxide layer with conductiveness and a diffusion barrier layer blocking diffusion of oxygen, and
wherein the metal suboxide layer comprises a metal suboxide selected from the group consisting of vanadium, chromium, iron, and rhenium.

38. The semiconductor memory device according to claim 37, wherein the metal suboxide layer and the diffusion barrier layer are stacked in the order from a conductive plug side of the electrode connected to the conductive plug.

39. The semiconductor memory device according to claim 37, wherein the metal suboxide layer has a barrier effect against silicon.

40. The semiconductor memory device according to claim 37, wherein the diffusion barrier layer is made of at least one selected from the group consisting of iridium, ruthenium, rhodium, rhenium and osmium, and oxides of iridium, ruthenium, rhodium, rhenium and osmium.

41. The semiconductor memory device according to claim 37, wherein the conductive plug is made of impurity doped polysilicon and a silicide film is formed at a contact interface of the conductive plug with the electrode connected to the conductive plug.

42. The semiconductor memory device according to claim 37, wherein the dielectric film is made of an $ABO_3$ perovskite structure compound.

43. The semiconductor memory device according to claim 42, wherein the dielectric film includes at least one material selected from the group consisting of materials expressed by chemical formulae of $SrTiO_3$, $(Ba,Sr)TiO_3$, $PbTiO_3$, $Pb(Zr,Ti)O_3$, $(Pb,La)TiO_3$, $(Pb,La)(Zr,Ti)O_3$, $BaTiO_3$, $LiNbO_3$, $LiTaO_3$ and $YMnO_3$.

44. The semiconductor memory device according to claim 37, wherein the dielectric/film is made of a bismuth layered perovskite structure compound.

45. The semiconductor memory device according to claim 44, wherein the dielectric film includes at least one material selected from the group consisting of materials expressed by chemical formulae of $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $BaBi_2Ta_2O_9$ and $BaBi_2Nb_2O_9$.

46. The semiconductor memory device according to claim 37, wherein the metal suboxide layer is constructed of a first layer and a second layer of different materials, the first layer includes the metal selected from the group consisting of vanadium, chromium, iron, and rhenium such that the first layer has a barrier effect against silicon and has conductiveness, the second layer of the metal suboxide layer comprises a noble metal layer that includes oxygen and at least one noble metal selected from the group consisting of iridium, ruthenium, rhodium, rhenium, osmium, palladium and platinum.

47. The semiconductor memory device according to claim 46, wherein the noble metal layer includes a transition metal selected from the group consisting of hafnium, tantalum, zirconium, vanadium, molybdenum and tungsten and has a composition expressed by a chemical formula M1aM2bOc, wherein M1 represents the noble metal; M2 represents the transition metal, and O represents Oxygen, and a, b, and c represent contents of respective metals, provided that the following relations are satisfied: $0.4<a<0.9$, $0.02<b<0.15$, $0.04<c$ and $a+b+c=1$.

48. A capacitive semiconductor device comprising:
a first electrode,
a dielectric film formed on the first electrode,
and a second electrode formed on the dielectric film;
wherein the first electrode includes a barrier layer that substantially prevents the diffusion of oxygen through the barrier layer and a metal suboxide layer having a first and a second layer, the first layer comprises a metal suboxide that has a barrier effect against silicon and has conductiveness, the second layer comprises a noble metal layer including oxygen.

49. The capacitive semiconductor device of claim 48, wherein the diffusion barrier layer is formed over the metal suboxide layer.

50. The capacitive semiconductor device of claim 48, wherein the metal suboxide layer includes at least one kind of metal a free energy of formation of whose oxide is smaller than that of silicon oxide.

51. The capacitive semiconductor device of claim 48, wherein the first layer of the metal suboxide layer is a titanium suboxide layer.

52. The capacitive semiconductor device of claim 48, wherein the first layer of the metal suboxide layer is a vanadium suboxide layer.

53. The capacitive semiconductor device of claim 48, wherein the diffusion barrier layer is made of at least one selected from the group consisting of iridium, ruthenium, rhodium, rhenium and osmium, and oxides of iridium, ruthenium, rhodium, rhenium and osmium.

54. The capacitive semiconductor device of claim 48, wherein the dielectric film is made of an $ABO_3$ perovskite structure compound.

55. The capacitive semiconductor device of claim 48, wherein the dielectric film is made of a bismuth layered perovskite structure compound.

56. The capacitive semiconductor device of claim 48, wherein the noble metal layer includes at least one noble metal selected from the group consisting of iridium, ruthenium, rhodium, rhenium, osmium, palladium and platinum.

57. The capacitive semiconductor device of claim 48, wherein the noble metal layer includes a transition metal selected from the group consisting of hafnium, tantalum, zirconium, vanadium, molybdenum and tungsten and has a composition expressed by a chemical formula M1aM2bOc, wherein M1 represents the noble metal; M2 represents the transition metal, and O represents Oxygen, and a, b, and c represent contents of respective metals, provided that the following relations are satisfied: $0.4<a<0.9$, $0.02<b<0.15$, $0.04<c$ and $a+b+c=1$.

58. A capacitive semiconductor device comprising:
a first electrode,
a dielectric film formed on the first electrode,
and a second electrode formed on the dielectric film;
wherein the first electrode includes a metal suboxide layer with conductiveness and a diffusion barrier layer blocking diffusion of oxygen, and
wherein the metal suboxide layer comprises a metal suboxide selected from the group consisting of vanadium, chromium, iron, and rhenium.

59. The capacitive semiconductor device of claim 58, wherein the diffusion barrier layer is formed on the metal suboxide layer.

60. The capacitive semiconductor device of claim 58, wherein the metal suboxide layer has a barrier effect against silicon.

61. The capacitive semiconductor device of claim 58, wherein the diffusion barrier layer is made of at least one selected from the group consisting of iridium, ruthenium, rhodium, rhenium and osmium, and oxides of iridium, ruthenium, rhodium, rhenium and osmium.

62. The capacitive semiconductor device of claim 58, wherein the dielectric film is made of an $ABO_3$ perovskite structure compound.

63. The capacitive semiconductor device of claim 58, wherein the dielectric film includes at least one material selected from the group consisting of materials expressed by chemical formulae of $SrTiO_3$, $(Ba,Sr)TiO_3$, $PbTiO_3$, $Pb(Zr,Ti)O_3$, $(Pb,La)TiO_3$, $(Pb,La)(Zr,Ti)O_3$, $BaTiO_3$, $LiNbO_3$, $LiTaO_3$ and $YMnO_3$.

64. The capacitive semiconductor device of claim 58, wherein the dielectric film is made of a bismuth layered perovskite structure compound.

65. The capacitive semiconductor device of claim 64, wherein the dielectric film includes at least one material selected from the group consisting of materials expressed by chemical formulae of $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $BaBi_2Ta_2O_9$ and $BaBi_2Nb_2O_9$.

66. The capacitive semiconductor device of claim 58, wherein the metal suboxide layer is constructed of a first layer and a second layer of different materials, the first layer includes the metal selected from the group consisting of vanadium, chromium, iron, and rhenium such that the first layer has a barrier effect against silicon and has conductiveness, the second layer of the metal suboxide layer comprises a noble metal layer that includes oxygen and at least one noble metal selected from the group consisting of iridium, ruthenium, rhodium, rhenium, osmium, palladium and platinum.

67. The capacitive semiconductor device of claim 66, wherein the noble metal layer includes a transition metal selected from the group consisting of hafnium, tantalum, zirconium, vanadium, molybdenum and tungsten and has a composition expressed by a chemical formula $M1_aM2_bO_c$, wherein M1 represents the noble metal; M2 represents the transition metal, and O represents Oxygen, and a, b, and c represent contents of respective metals, provided that the following relations are satisfied: $0.4<a<0.9$, $0.02<b<0.15$, $0.04<c$ and $a+b+c=1$.

* * * * *